(12) United States Patent
Kubo (10) Patent No.: US 6,429,078 B2
(45) Date of Patent: Aug. 6, 2002

(54) METHOD OF MANUFACTURING INSULATING-GATE SEMICONDUCTOR DEVICE

(75) Inventor: Hirotoshi Kubo, Oizumi-machi (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/817,118

(22) Filed: Mar. 27, 2001

(30) Foreign Application Priority Data

Mar. 27, 2000 (JP) ........................................ 2000-085537

(51) Int. Cl.$^7$ ............................................ H01L 21/336
(52) U.S. Cl. ...................... 438/270; 438/259; 438/268; 438/272; 257/330
(58) Field of Search ................................. 257/302, 329, 257/330; 438/259, 268, 270, 272

(56) References Cited

U.S. PATENT DOCUMENTS 6,127,699 A * 10/2000 Ni et al. ...................... 257/302

\* cited by examiner

Primary Examiner—Amir Zarabian
Assistant Examiner—Christian D. Wilson
(74) Attorney, Agent, or Firm—Morrison & Foerster, LLP (57) ABSTRACT

The cell density of power MOSFET used as a switch is determined by the width of the trench formed in the device, the processing limit of which is limited by the spatial resolution of the exposure apparatus used in the photolithographic process. This invention provides a method of manufacturing such devices which overcomes the processing limitation imposed by the exposure apparatus, and doubles the cell density and reduces the input capacitance for further reducing the on-state resistance and improving the switching speed. By forming a second CVD oxide film over a first oxide film defining the opening for forming a trench and subsequent anisotropic RIE etching of the second film, a side-wall film is added to the mask pattern, which promotes a further reduction of the width of the trench by more than one half.

7 Claims, 8 Drawing Sheets

PRIOR ART

FIG.12

PRIOR ART

FIG.13

PRIOR ART

FIG.14

PRIOR ART

FIG.15

PRIOR ART

FIG.16

PRIOR ART

FIG.17

PRIOR ART

FIG.18

PRIOR ART

FIG.19

PRIOR ART

FIG.20

PRIOR ART

METHOD OF MANUFACTURING INSULATING-GATE SEMICONDUCTOR DEVICE

FIELD OF THE INVENTION

This invention relates to a method of manufacturing insulating-gate semiconductor device, more specifically to a method of manufacturing insulating-gate semiconductor device in which a fine trench structure is created based on trench width reduction using a self-aligned formation of an overlapping masking layer.

BACKGROUND OF THE INVENTION

Recently, with the growth of the mobile computing/communication terminal market there has been an increasing demand for lithium-ion batteries which are smaller in size and yet larger in capacity. The protecting circuit board for the management of charging and discharging the lithium-ion battery has to be small in order to meet the need for total weight reduction of the mobile computing/communication terminal and in order to withstand short circuits due to excessive loads. In this application, it was required that the protecting circuit boards be small, as the boards were housed inside the container of the lithium-ion battery. This size reduction has been accomplished by the use of COB (Chip on Board) technology using multiple chip components. On the other hand, as the switching devices on the board such as power MOSFET are connected to the lithium-ion battery in series, there is also a need for reducing the on-state resistance of the switching devices. This is an indispensable ingredient in mobile telephone applications for extending the calling period and the stand-by period.

For achieving a low on-state resistance, developments have been made for increasing the cell density by applying micro-fabrication technology to the chip manufacturing process. As a result, in a typical planar structure where the channel was formed on the surface of the semiconductor substrate, the cell density was 7.4 million per square inch. Further, in the first-generation trench structure where the channel was formed along the side of the trench, the cell density was 25 million per square inch. Improvements were made in the second-generation trench structure so that the cell density reached 72 million per square inch.

As described above, the cell density has been increased by the adoption of the trench structure for forming the cells, and the on-state resistance has decreased accordingly. However, at this point, there is no room for manipulating the current micro-fabrication process for further reducing the size of the trench structure. The only way to achieve the reduction is to introduce a new exposure apparatus with a higher spatial resolution in the micro-fabrication process, if such an apparatus is available.

SUMMARY OF THE INVENTION

This invention involves a micro-fabrication process in which the process limitations due to the spatial resolution of the exposure apparatus used in the photolithographic process can be overcome by modifying the process for forming the masking layer for the trench, this overcomes the problems described above.

The invention provides method of manufacturing an insulating-gate semiconductor device that includes forming a channel layer on a drain region of a semiconductor substrate, forming an opening for forming a trench in a first insulating film formed on the surface of the semiconductor substrate, forming a side-wall film around a side wall of the opening for forming a trench by anisotropic etching of a second insulating film formed over the first insulating film, forming a trench piercing through the channel layer by etching using the first insulating film and the side-wall film as a mask, forming a gate insulating film on an inside wall of the trench, forming a gate electrode by filling the trench with a semiconductor material, and forming a source region adjacent to the trench in the surface region of the channel region.

In the manufacturing method described above, the side-wall film is formed based on a self-aligned formation of the second insulating film over the first insulating film. Thus, the side-wall film further reduces the width of the opening for forming a trench in the mask pattern, the processing limit of which is determined by the spatial resolution of the exposure apparatus used for creating the photoresist mask pattern. As a result, it is possible to create a trench structure of a size which is smaller than the spatial resolution of the exposure apparatus.

Based on this manufacturing method, it is possible to use current manufacturing facilities, especially the exposure apparatus, for manufacturing devices having finer trench structures than the current device without requiring advanced manufacturing facilities. For example, in a conventional process, the opening for forming a trench was 1.0 $\mu$m, and accordingly the width of the trench was 1.0 $\mu$m. When the manufacturing method of the invention was applied using the same manufacturing facilities, the opening for forming the trench was the same, but the width of the trench was reduced, by more than one half, to 0.4 $\mu$m.

The manufacturing method of the invention increases the cell density by about two times while keeping the same operational surface area as the conventional device. Thus, the on-state resistance increases accordingly, and the properties of the switching device are improved.

Furthermore, it is another advantage of this invention that the smaller width of the trench allows the reduction of the cross-sectional area of the trench, resulting in a smaller capacitance between the gate and the source of the trench as well as a smaller capacitance between the gate and the drain of the trench. This type of capacitance has a significant influence on the cut-off frequency as input capacitance and feedback capacitance, the reduction of which improves the switching speed.

BRIEF DESCRIPTION OF THE DRAWINGS

The invention may be better understood, and its objectives, features, and advantages made apparent to those skilled in the art, by referring to the accompanying drawings.

DETAILED DESCRIPTION OF THE INVENTION

The manufacturing method of the invention will be described hereinafter, taking an N-channel device as an example, by referring to FIG. 1 through FIG. 10.

Figure 1:
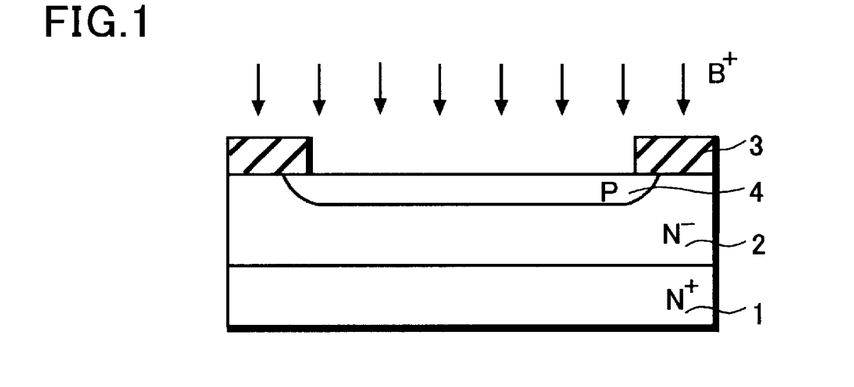
FIG. 1 is a cross-sectional view of a semiconductor device intermediate at a step of the method of manufacturing an insulating-gate semiconductor device of this invention.

FIG. 1 shows a process for forming channel layer 4. First, an epitaxial N⁻ silicon layer is grown on an N+ silicon semiconductor substrate 1 to form a drain region 2. Then, oxide film 3 is formed on the surface of the epitaxial layer 2 and a portion of oxide film 3 corresponding to channel layer 4 is removed by etching. Using the oxide film 3 as a mask, boron dopants with a dose of about $1.0 \times 10^{13}$ cm$^{-2}$ are injected through the mask into the drain region 2, and thermally diffused for forming P-type channel 4.

Figure 2:
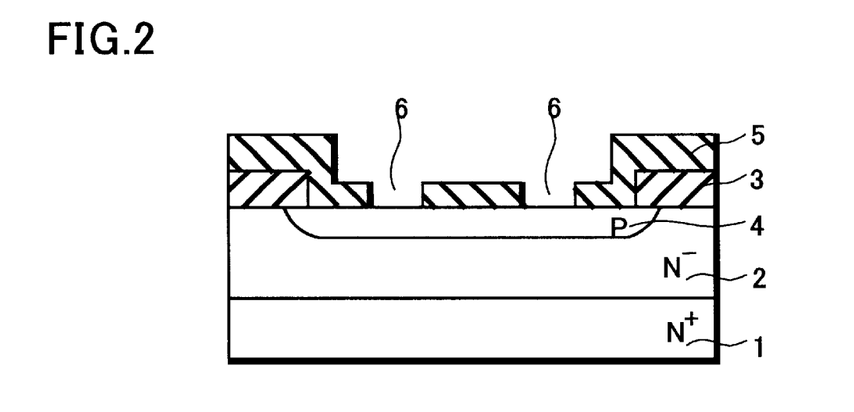
FIG. 2 is a cross-sectional view of a semiconductor device intermediate at a step of the method of manufacturing an insulating-gate semiconductor device of this invention following FIG. 1.

FIG. 2 follows FIG. 1 and shows a process for creating an opening for forming a trench 6. A first insulating film, an oxide film 5 formed by CVD (chemical vapor deposition) in this embodiment, is formed on the entire top surface of the device intermediate. The first oxide film 5 is made of NSG (non-doped silicate glass) and has a thickness of 3000 angstrom. Then, a photoresist film is formed on the CVD oxide film 5 and lithographically patterned to create a masking pattern for forming the opening for forming a trench 6. The CVD oxide film 5 is dry-etched through the photoresist mask and the opening for forming a trench 6 is created in the area where the trench is to be formed. The width of the opening is about 1.0 μm and the channel layer 4 is exposed through the opening. Though a CVD process is used to form the first oxide film 5 in this embodiment, a thermal oxidation process can be used instead. Furthermore, the CVD oxide film 5 can be replaced by a nitride film, which is capable of preventing contamination from the outside environment, or a multi-layer film in which the nitride film is formed on the oxide film.

Figure 3:
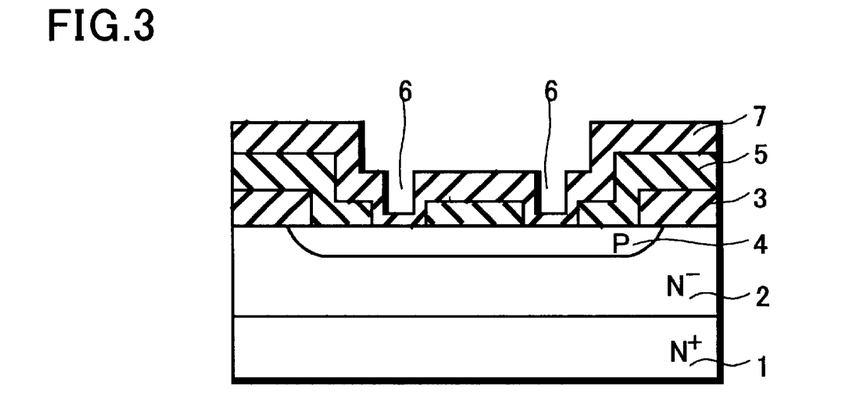
FIG. 3 is a cross-sectional view of a semiconductor device intermediate at a step of the method of manufacturing an insulating-gate semiconductor device of this invention.
Figure 4:
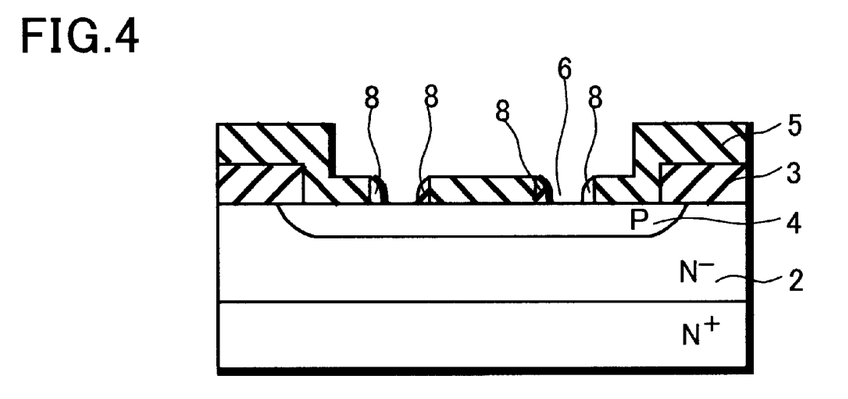
FIG. 4 is a cross-sectional view of a semiconductor device intermediate at a step of the method of manufacturing an insulating-gate semiconductor device of this invention following FIG. 3.

A process for forming a side-wall film 8, which is unique in the present invention, is now described by referring to FIG. 3 and FIG. 4.

FIG. 3 shows a process for forming a second insulating film on the first insulating film. A second oxide film 7 is formed on the entire surface of the first CVD oxide film 5, including the inside wall of the opening for forming a trench 6, using a LP-CVD process or LP-TEOS. The deposition on the inside wall of the opening forms the side-wall film. The thickness of the second oxide film is about 5000 angstrom. In this configuration, the CVD oxide film 7 can be replaced by a nitride film, which is capable of preventing contamination from the outside environment, or by a multi-layer film made of the nitride film and the oxide film.

FIG. 4 shows a process for anisotropically etching the second CVD oxide film 7. In this process, an anisotropic RIE (reactive ion etching) is used for removing the second CVD oxide film 7 without a mask since the anisotropic RIE has much higher etching rate in the vertical direction than in the horizontal direction. As a result, when the second oxide film 7 is removed from the surface of the first oxide film 5, the side-wall film 8 emerges as a self-aligned oxide layer covering the inside wall of the opening for forming a trench 6. Since the first CVD oxide film 5 has a thickness of about 3000 angstrom, the side-wall film 5 has a thickness of about 3000 angstrom at both sides of the trench, resulting in a reduction of the width of the trench from 1.0 μm, which is the width of the original opening for forming a trench 6, to about 0.4 μm.

Figure 5:
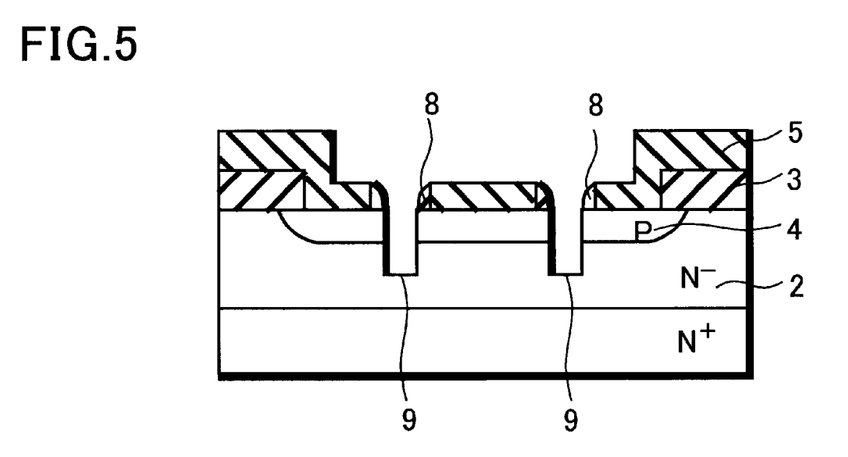
FIG. 5 is a cross-sectional view of a semiconductor device intermediate at a step of the method of manufacturing an insulating-gate semiconductor device of this invention.

FIG. 5 shows a process for forming the trench 9. The silicon semiconductor substrate is etched using a CF-based or HBr-based etching gas with the CVD oxide film 5 and the side-wall film 8 being used as a mask for forming a trench 9 piercing through the channel layer 4 and reaching the drain region 2. The depth of the trench is about 2.0 μm and its width is about 0.4 μm, as the side-wall portion 8 of the mask protects the extra region which is not covered by the first CVD oxide film 5.

Figure 6:
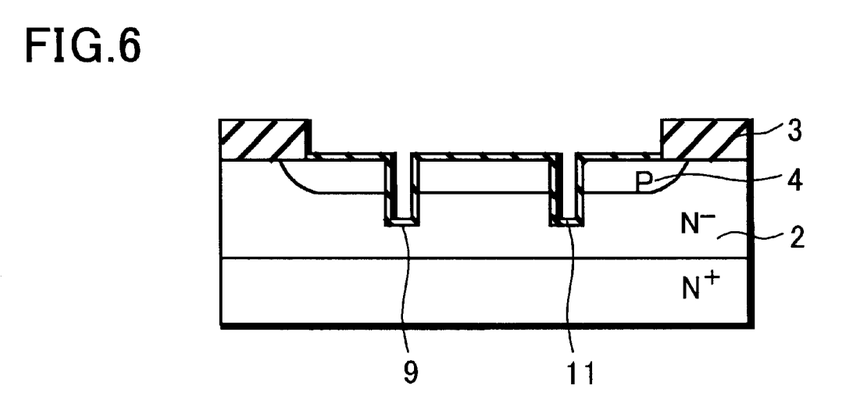
FIG. 6 is a cross-sectional view of a semiconductor device intermediate at a step of the method of manufacturing an insulating-gate semiconductor device of this invention following FIG. 5.

FIG. 6 shows a process for forming a gate insulating film, which is oxide film 11 in this embodiment. First, an oxide film, which is not shown in the figure, is formed on the inside wall of the trench and the surface of the channel layer 4 in a dummy oxidation (sacrificed oxidation) process, which is required to cure the damage caused by the previous dry etching process. Then, the oxide film and the first CVD oxide film 5 are removed by another etching, and the device intermediate is heated above 1000° C. for oxidizing the silicon until a gate oxide film 11 of a thickness of about 700 angstrom is formed on the top surface of the device intermediate.

Figure 7:
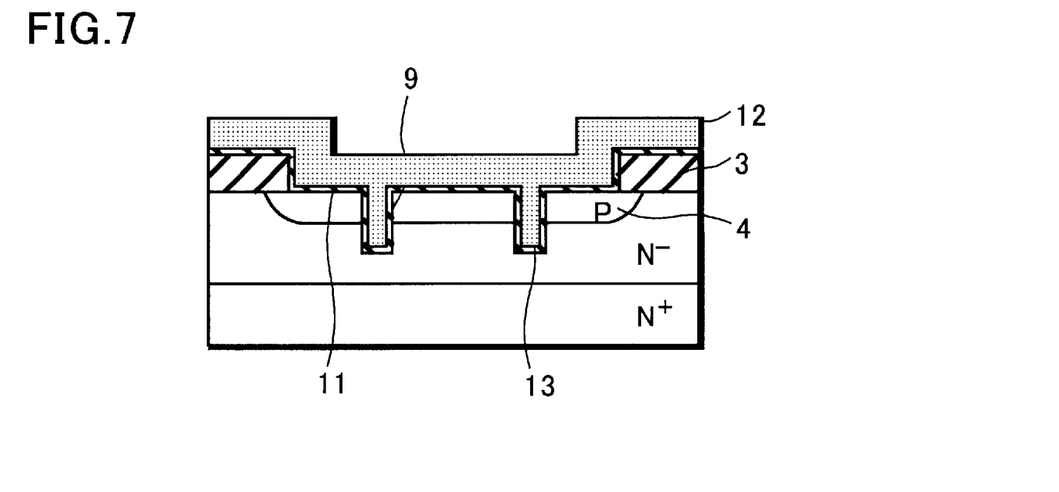
FIG. 7 is a cross-sectional view of a semiconductor device intermediate at a step of the method of manufacturing an insulating-gate semiconductor device of this invention following FIG. 6.

FIG. 7 follows FIG. 6 and shows a process for forming gate electrode 13. First, a polysilicon layer 12 without dopants is deposited on the entire top surface of the device intermediate with a thickness larger than one half of the width of the opening for forming a trench 6, which is about 5000 angstrom in this embodiment. Phosphorus dopants are injected into the polysilicon at a high dose and diffused for making the polysilicon highly conductive. The polysilicon layer 12 is then removed from the top surface of the device intermediate by another etching without a mask, leaving the gate electrode 13 buried in the trench 9.

Figure 8:
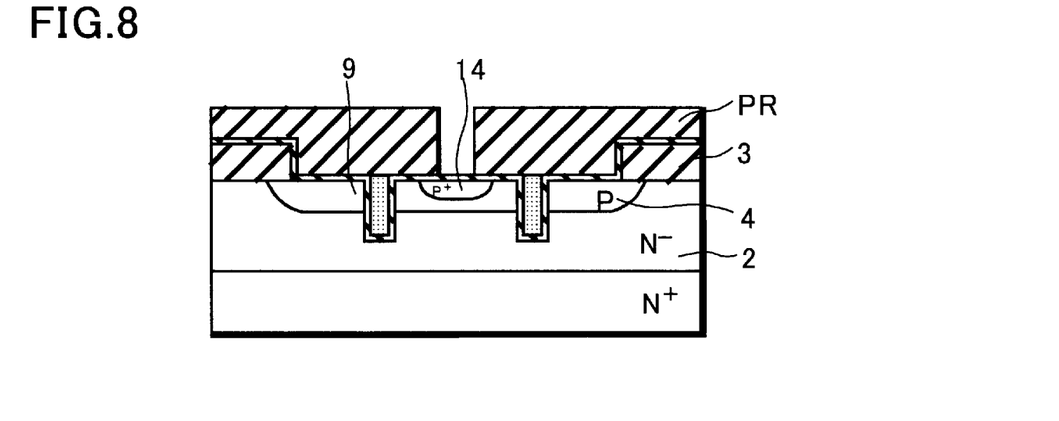
FIG. 8 is a cross-sectional view of a semiconductor device intermediate at a step of the method of manufacturing an insulating-gate semiconductor device of this invention following FIG. 7.

FIG. 8 follows the process of FIG. 7 and shows a process for forming a body region 14. First, a photoresist film PR is formed on the top surface of the device intermediate of FIG. 7 except a region between trenches 9, and boron dopants are injected into the portion of channel layer 4 exposed through the opening with a dose of $5.0 \times 10^{14}$ cm$^{-2}$ for making body region 14 of P$^+$ type. Then, the photoresist film PR is removed from the top surface. Body region 14 is required for the voltage stabilization of a substrate including the drain region 2 and the channel layer 4.

Figure 9:
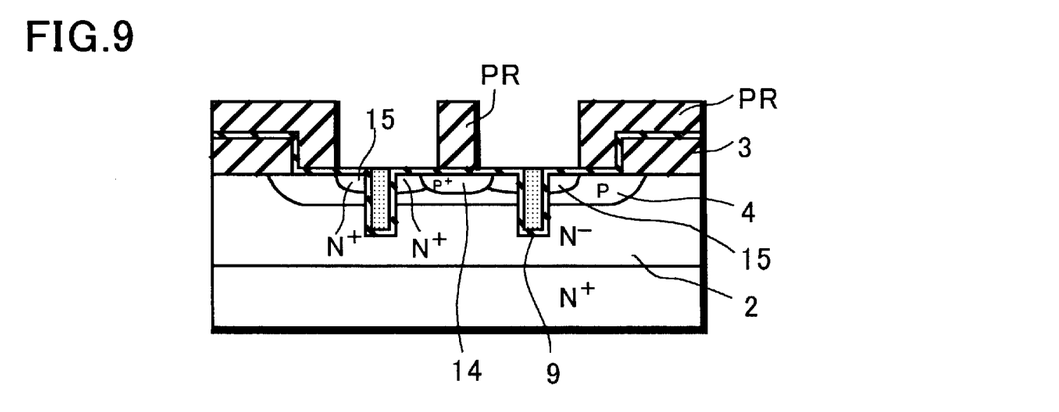
FIG. 9 is a cross-sectional view of a semiconductor device intermediate at a step of the method of manufacturing an insulating-gate semiconductor device of this invention following FIG. 8.

FIG. 9 shows a process for forming a source region 15. First, another photoresist film PR is formed on the top surface of the device intermediate except for the trench 9 and the region of the channel layer 4 adjacent to the trench 9, and arsenic dopants are injected into the portion of the channel layer 4 exposed through the opening with a dose of $5.0 \times 10^{15}$ cm$^{-2}$ for making a source region 15 of N$^+$ type. Then, the photoresist film PR is removed from the top surface. As a result, a channel, not shown in the figure, is formed along the side of the trench 9 between the drain region 2 and the source region 15.

Figure 10:
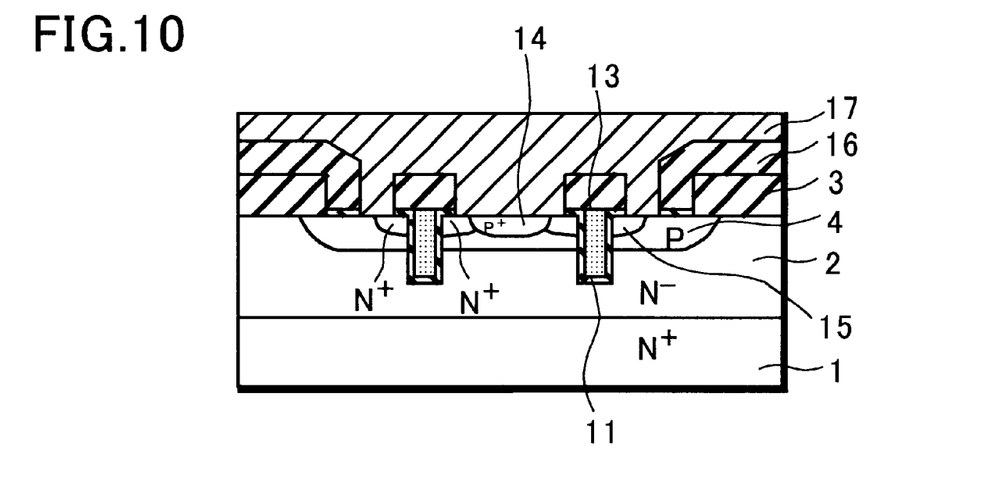
FIG. 10 is a cross-sectional view of a semiconductor device intermediate at a step of the method of manufacturing an insulating-gate semiconductor device of this invention following FIG. 9.

FIG. 10 shows a process for forming a source electrode 17. First, an interlayer insulating film 16 made of BPSG (boron phosphorus silicate glass) or the like is deposited on the entire top surface of the device intermediate using a CVD process or the like. The BPSG film is removed by etching, except a few regions including the regions above the gate electrode 13, using a photoresist film patterned accordingly as a mask. Finally, a source electrode 17 made of aluminum or aluminum alloy is formed on the top surface of the device intermediate by a sputtering process for making contact with the body region 14 and the source region 15.

For further understanding the advantages of the manufacturing method of the present invention, the conventional manufacturing method of the similar device will be described hereinafter by referring to FIG. 11 through FIG. 20. A comparison between the two manufacturing methods will clarify the significant step taken in the present invention.

Figure 11:
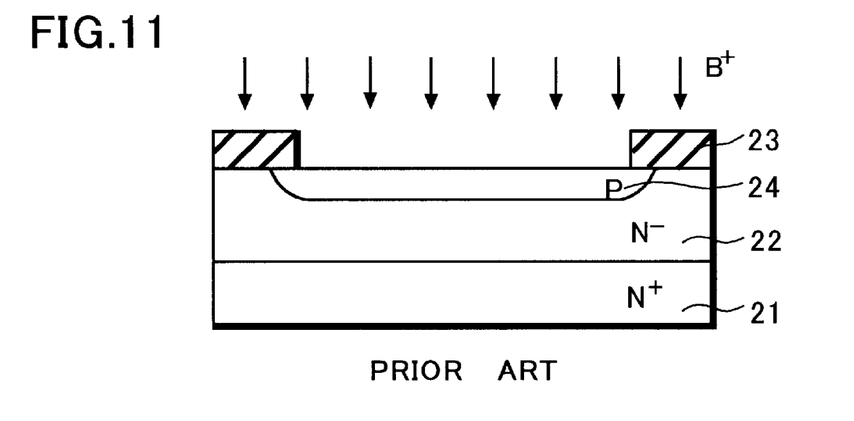
FIG. 11 is a cross-sectional view of a semiconductor device intermediate at a step of a conventional method of manufacturing an insulating-gate semiconductor device.

FIG. 11 shows a process for forming a channel layer 24. First, an epitaxial N$^-$ silicon is grown on an N$^+$ silicon layer semiconductor substrate 21 to form a drain region 22. Then, an oxide film 23 is formed on the surface of the epitaxial layer and a portion of the oxide film 23 corresponding to the channel layer 24 is removed by etching. Using the oxide film 23 as a mask, boron dopants with a dose of $1.0 \times 10^{13}$ cm$^{-2}$ are injected through the mask into the drain region 22, and are thermally diffused for forming a P-type channel 24.

The process for forming the trench will be now described by referring to FIG. 12 through FIG. 15.

Figure 12:
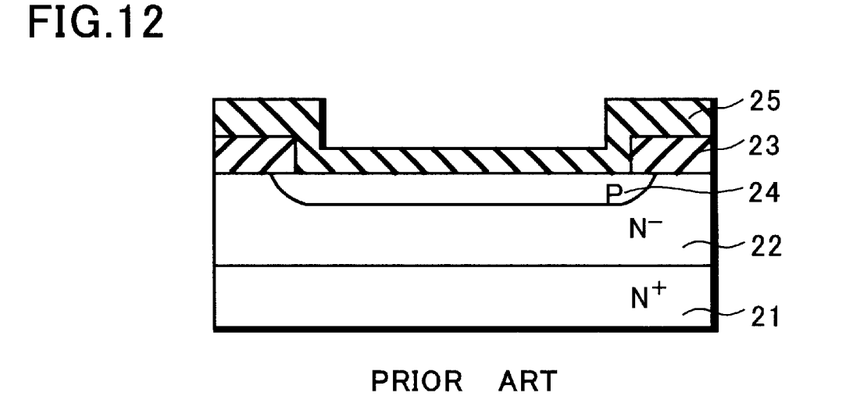
FIG. 12 is a cross-sectional view of a semiconductor device intermediate at a further of a conventional method of manufacturing an insulating-gate semiconductor device.

FIG. 12 shows a CVD process for depositing oxide film 25, which is made of NSG and has a thickness of 3000 angstrom. Though a CVD process is used to form the oxide film 25, a thermal oxidation process can be used instead.

Figure 13:
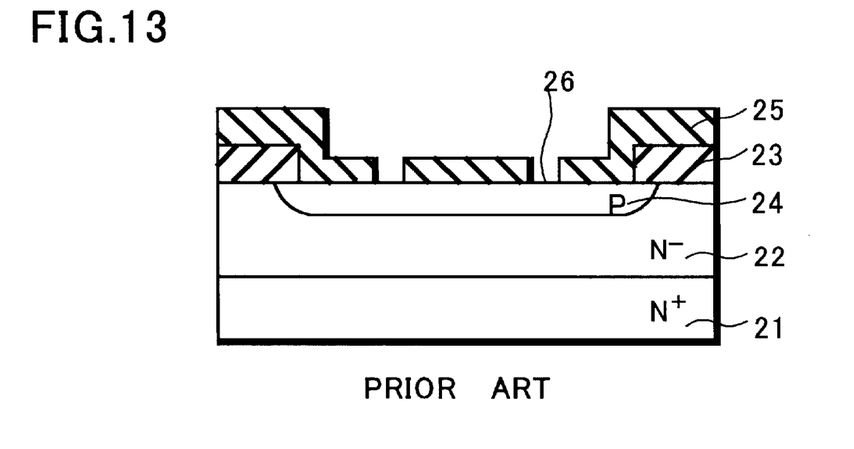
FIG. 13 is a cross-sectional view of a semiconductor device intermediate at a further step of a conventional method of manufacturing an insulating-gate semiconductor device.

FIG. 13 shows a process for forming a masking pattern made of oxide film 25. First, a photoresist film is formed on the CVD oxide film 25 and lithographically patterned to create a masking pattern for forming the opening for forming trench 26. The CVD oxide film 25 is then dry-etched through the photoresist mask, and the opening for forming a trench 26 is created in the area where the trench is to be formed. The width of the opening is about 1.0 μm and the channel layer 24 is exposed through the opening.

Figure 14:
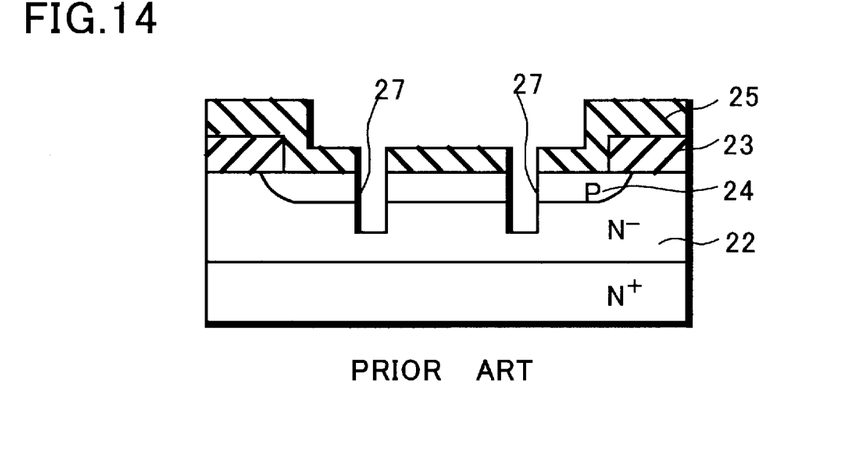
FIG. 14 is a cross-sectional view of a semiconductor device intermediate at a further step of a conventional method of manufacturing an insulating-gate semiconductor device.

FIG. 14 shows a process for forming trench 27. The silicon semiconductor substrate is etched using a CF based or HBr based etching gas with the CVD oxide film 25 being used as a mask for forming a trench 27 piercing through the channel layer 24 and reaching the drain region 22. The depth of the trench is about 2.0 μm and its width is about 1.0 μm, as the width of the opening for forming a trench 26 dictates the width of the trench 27.

Figure 15:
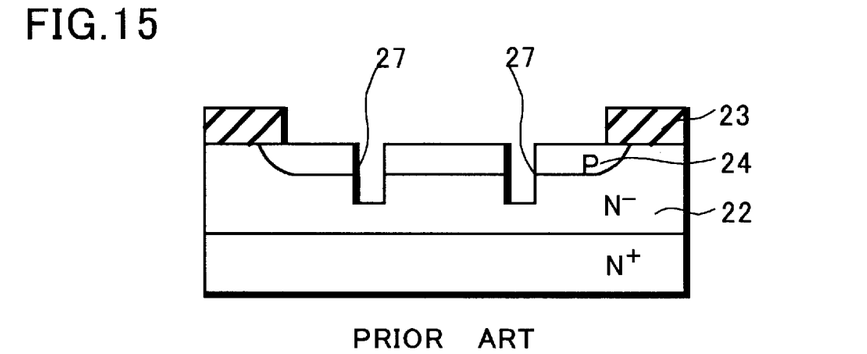
FIG. 15 is a cross-sectional view of a semiconductor device intermediate at a further step of a conventional method of manufacturing an insulating-gate semiconductor device.

FIG. 15 shows a process for removing the CVD oxide film 25. First, an oxide film, which is not shown in the figure, is formed on the inside wall of the trench 27 and the surface of the channel layer 24 in a dummy oxidation process, which is required to cure the damage caused by the previous dry etching process. Then, the oxide film and the CVD oxide film 25 are removed by another etching.

Figure 16:
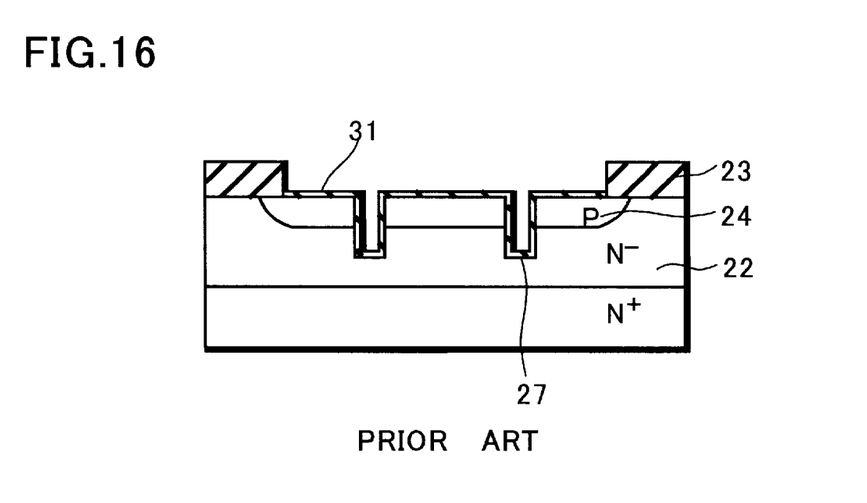
FIG. 16 is a cross-sectional view of a semiconductor device intermediate at a further step of a conventional method of manufacturing an insulating-gate semiconductor device.

FIG. 16 shows a process for forming gate insulating film 31. In this process, the device intermediate is heated above 1000° C. for oxidizing the silicon until a gate oxide film 31 of a thickness of about 700 angstrom is formed on the top surface of the device intermediate.

Figure 17:
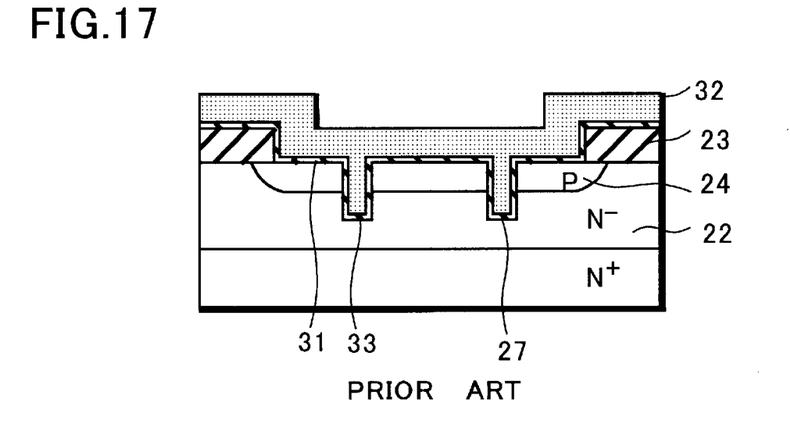
FIG. 17 is a cross-sectional view of a semiconductor device intermediate at a further step of a conventional method of manufacturing an insulating-gate semiconductor device.

FIG. 17 shows a process for forming a gate electrode 33 buried in the trench 27. First, a polysilicon layer 32 without dopants is deposited on the entire top surface of the device intermediate. Then, phosphorus dopants are injected into the polysilicon layer at a high dose and diffused for making the polysilicon highly conductive. The polysilicon layer 32 is then removed from the top surface of the device intermediate by another etching without a mask, leaving gate electrode 33 buried in the trench 27.

Figure 18:
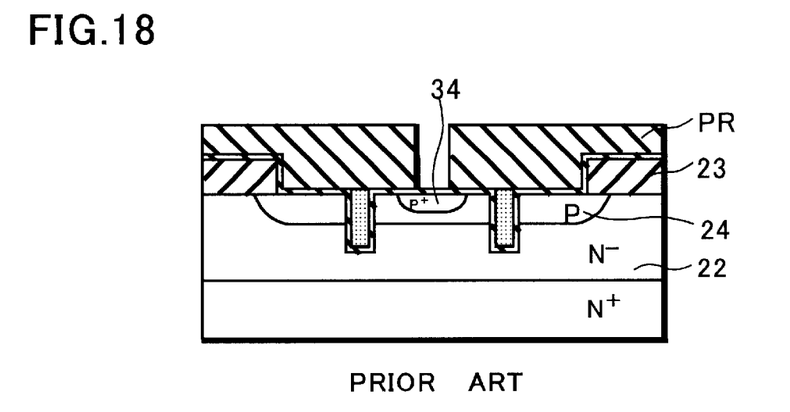
FIG. 18 is a cross-sectional view of a semiconductor device intermediate at a further step of a conventional method of manufacturing an insulating-gate semiconductor device.

FIG. 18 shows a process for forming a body region 34. First, a photoresist film PR is formed on the top surface of the device intermediate except the region between the trenches 27, and boron dopants are injected into the portion of the channel layer 24 exposed through the opening with a dose of $5.0 \times 10^{14}$ cm$^{-2}$ for making a body region 34 of P$^+$ type. Then, the photoresist film PR is removed from the top surface.

Figure 19:
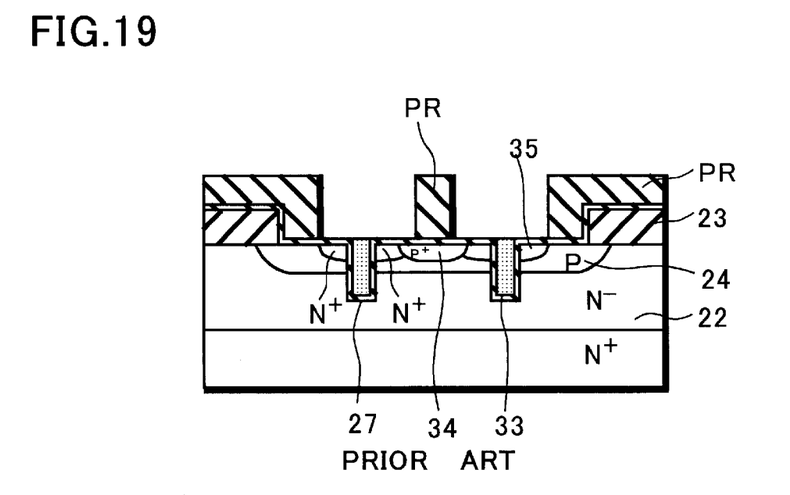
FIG. 19 is a cross-sectional view of a semiconductor device intermediate at a further step of a conventional method of manufacturing an insulating-gate semiconductor device.

FIG. 19 shows a process for forming a source region 35. First, another photoresist film PR is formed on the top surface of the device intermediate except the source region 35 and the gate electrode 33, and arsenic dopants are injected into the channel layer 24 using the photoresist film as a mask with a dose of $5.0 \times 10^{15}$ cm$^{-2}$ for making a source region 35 of N$^+$ type. Then, the photoresist film PR is removed from the top surface.

Figure 20:
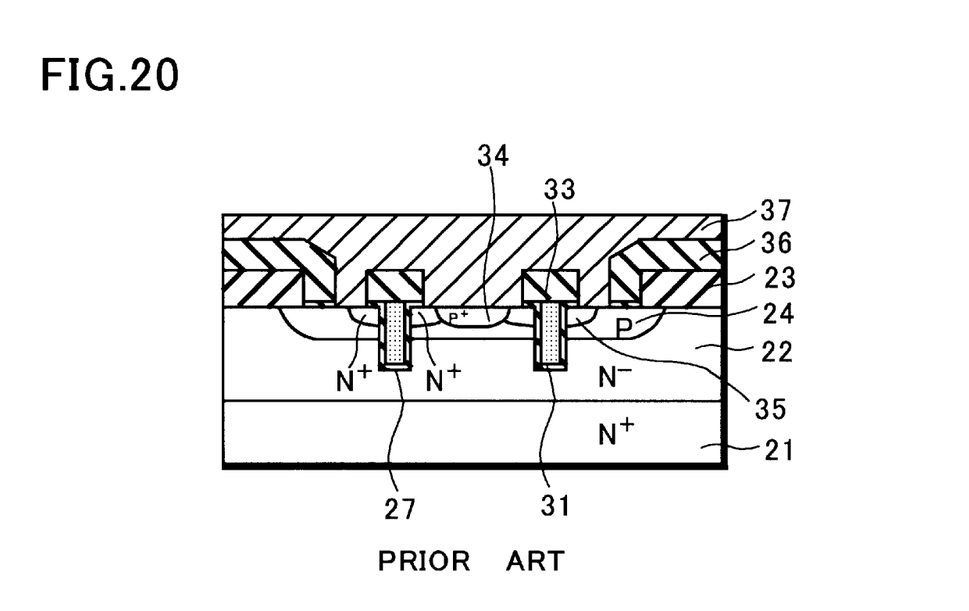
FIG. 20 is a cross-sectional view of a semiconductor device intermediate at a further step of a conventional method of manufacturing an insulating-gate semiconductor device.

FIG. 20 shows a process for forming a source electrode 37. First, an interlayer insulating film 36 made of BPSG or the like is deposited on the entire top surface of the device intermediate using a CVD process or the like. The BPSG film is removed by etching, except for a few regions including the ones above the gate electrode 13, using a photoresist film patterned accordingly as a mask. Finally, a source electrode 37 made of aluminum or aluminum alloy is formed on the top surface of the device intermediate by a sputtering process for making a contact to the body region 34 and the source region 35.

By comparing the method of manufacturing insulating-gate semiconductor device of this invention to that of the conventional art, it is obvious to those skilled in the art that the manufacturing method of this invention has a significant advantage over the conventional method by adding only a few process steps to those of the conventional art. This addition includes the formation of the second insulating film over the first insulating film, as shown in FIG. 3, and the anisotropic etching by RIE of the second insulating film, as shown in FIG. 4. These two processes are compatible with other processes in the manufacturing method, and are easily to be incorporated. Yet, the improvement produced by the added steps is significant enough to reduce the width of the trench to about one half of the width of the trench manufactured by the conventional method. In the conventional method described above, the opening for forming a trench is 1.0 $\mu$m, and accordingly the width of the trench is 1.0 $\mu$m. In the method of the embodiment of the present invention described above, the opening for forming a trench was the same, but the width of the trench reduced, by more than one half, to 0.4 $\mu$m.

The key in achieving the above improvement is the formation of the side-wall film, which is formed based on a self-aligned formation of the second insulating film over the first insulating film. This side-wall film further reduces the width of the opening for forming a trench in the mask pattern, the processing limit of which is determined by the spatial resolution of the exposure apparatus used for creating the photoresist mask pattern. As a result, it is possible to create a trench structure, the size of which is smaller than the spatial resolution of the exposure apparatus.

In the aforementioned embodiment, a manufacturing method for an N-channel device is described. However, it is also possible that a P-channel device may be fabricated based on the method of the present invention. This is one of many modifications of this invention within the scope of the claims of the application.

While the invention has been described and illustrated with respect to a particular embodiment, it will be understood by those skilled in the art that various other changes and modifications may be made without departing from the spirit and scope of the invention. All such modifications are intended for inclusion within the scope of the following claims.

What is claimed is:

1. A method of manufacturing an insulating-gate semiconductor device, comprising:

forming a channel layer of a conduction type in a surface region of a semiconductor substrate so that the channel layer is disposed in the surface region and above a remainder of the surface region in which is formed a drain region, said surface region having an opposite conduction type to the channel layer;

forming a first insulating film on the surface region;

forming an opening for forming a trench in the first insulating film;

forming a second insulating film over the opening;

forming a side-wall film around a side wall of the opening by anisotropic etching of the second insulating film;

forming a trench piercing through the channel layer by etching, said first insulating film and said side-wall film being used as a mask;

forming a gate insulating film on an inside wall of the trench;

forming a gate electrode by filling the trench with a semiconductor material; and forming a source region adjacent to the filled trench in a surface region of the channel layer, the conduction type of said source region being the same as the conduction type of the drain region.

2. A method of manufacturing insulating-gate semiconductor device according to claim 1, wherein the width of the trench is smaller than about one half of the width of the opening for forming a trench.

3. A method of manufacturing insulating-gate semiconductor device according to claim 1, wherein the first insulating film is an oxide film formed by a chemical vapor deposition process or an oxide film formed by thermal oxidation process.

4. A method of manufacturing insulating-gate semiconductor device according to claim 1, wherein the first insulating film is a nitride film or a multi-layer film made of a nitride film and an oxide film.

5. A method of manufacturing insulating-gate semiconductor device according to claim 1, wherein the second insulating film is an oxide film formed by a chemical vapor deposition process.

6. A method of manufacturing insulating-gate semiconductor device according to claim 1, wherein the second insulating film is a nitride film or a multi-layer film made of a nitride film and an oxide film.

7. A method of manufacturing an insulating-gate semiconductor device according to claim 1, wherein the forming the source region comprises placing the source region above the drain region relative to the surface of the substrate.

* * * * *